(12) United States Patent
Sakamoto et al.

(10) Patent No.: US 9,605,907 B2
(45) Date of Patent: Mar. 28, 2017

(54) PHASE CHANGE COOLER AND ELECTRONIC EQUIPMENT PROVIDED WITH SAME

(75) Inventors: Hitoshi Sakamoto, Tokyo (JP); Minoru Yoshikawa, Tokyo (JP); Kenichi Inaba, Tokyo (JP); Takeya Hashiguchi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 574 days.

(21) Appl. No.: 13/638,474

(22) PCT Filed: Mar. 15, 2011

(86) PCT No.: PCT/JP2011/056079
§ 371 (c)(1),
(2), (4) Date: Sep. 28, 2012

(87) PCT Pub. No.: WO2011/122332
PCT Pub. Date: Oct. 6, 2011

(65) Prior Publication Data
US 2013/0025826 A1    Jan. 31, 2013

(30) Foreign Application Priority Data
Mar. 29, 2010    (JP) ................................ 2010-076126

(51) Int. Cl.
*F28D 15/02* (2006.01)
*H01L 23/427* (2006.01)
*H01L 23/467* (2006.01)

(52) U.S. Cl.
CPC ........ *F28D 15/0266* (2013.01); *H01L 23/427* (2013.01); *H01L 23/467* (2013.01); *H01L 2924/0002* (2013.01)

(58) Field of Classification Search
CPC ............ F28D 15/0266; H05K 7/20309; H05K 7/20318; H05K 7/20336; H05K 7/20663;
(Continued)

(56) References Cited

U.S. PATENT DOCUMENTS 1,900,715 A * 3/1933 Jaeger ...................... B01J 8/067
165/104.31
3,512,582 A * 5/1970 Chu ...................... H01L 23/427
165/104.27
(Continued)

FOREIGN PATENT DOCUMENTS

CN  101578029 A  11/2009
JP   58206347 A  12/1983
(Continued)

OTHER PUBLICATIONS

The international search report for PCT/JP2011/056079 mailed on Jun. 28, 2011.
(Continued)

*Primary Examiner* — Ryan J Walters
*Assistant Examiner* — For K Ling

(57) ABSTRACT

A phase change cooler of the present invention includes: a plurality of heat receiving units that cause a refrigerant to change phase from liquid to gas by heat received from a heat generating body; one heat radiating unit that causes the refrigerant to change phase from gas to liquid by radiating heat to surrounding area; a plurality of vapor tubes that respectively transport the refrigerant in a vapor state from each of the heat receiving units to the heat radiating unit; a liquid tube that respectively circulates the refrigerant in a liquid state from the heat radiating unit to each of the heat receiving units; and a bypass tube that connects each of the heat receiving units to each other.

15 Claims, 20 Drawing Sheets

(58) Field of Classification Search
CPC ........... H05K 7/20672; H05K 7/20936; H05K 7/2029; H05K 7/208; H05K 7/20809; H05K 7/20818; H05K 7/20827; H05K 7/20681; H05K 7/2069; H05K 7/20881; H05K 7/2099; H05K 7/20236; H05K 7/203
USPC ............... 165/80.4, 104.21, 104.33; 361/700
See application file for complete search history.

(56) References Cited

U.S. PATENT DOCUMENTS

| | | | |
|---|---|---|---|
| 3,609,991 A * | 10/1971 | Chu et al. | 62/333 |
| 5,940,270 A * | 8/1999 | Puckett | 361/699 |
| 6,005,772 A * | 12/1999 | Terao | F28D 15/0233 165/104.21 |
| 6,536,510 B2 * | 3/2003 | Khrustalev et al. | 165/104.33 |
| 6,549,408 B2 * | 4/2003 | Berchowitz | 361/700 |
| 7,457,118 B1 * | 11/2008 | French et al. | 361/700 |
| 7,686,071 B2 * | 3/2010 | Silverstein | 165/110 |
| 8,345,425 B2 * | 1/2013 | Toyoda et al. | 361/700 |
| 8,913,386 B2 * | 12/2014 | Gradinger et al. | 361/700 |
| 8,934,245 B2 * | 1/2015 | Yoshikawa | 361/700 |
| 2002/0075652 A1 | 6/2002 | Berkowitz | |
| 2004/0040695 A1 * | 3/2004 | Chesser | F28D 15/043 165/104.21 |
| 2005/0056406 A1 * | 3/2005 | Tanaka et al. | 165/104.33 |
| 2005/0063158 A1 * | 3/2005 | Thiele et al. | 361/700 |
| 2005/0067147 A1 * | 3/2005 | Thayer et al. | 165/80.4 |
| 2005/0081534 A1 * | 4/2005 | Suzuki et al. | 62/50.2 |
| 2005/0155744 A1 * | 7/2005 | Ippoushi | F28D 15/0266 165/104.11 |
| 2007/0175614 A1 * | 8/2007 | Li | F28D 15/0266 165/104.26 |
| 2007/0227703 A1 * | 10/2007 | Bhatti et al. | 165/104.26 |
| 2007/0273024 A1 * | 11/2007 | Madsen | F28D 15/0266 257/715 |
| 2007/0284088 A1 * | 12/2007 | Chun | 165/104.21 |
| 2009/0084525 A1 * | 4/2009 | Satou et al. | 165/104.21 |
| 2009/0266098 A1 | 10/2009 | Nishijima et al. | |
| 2010/0071880 A1 * | 3/2010 | Kim et al. | 165/104.26 |
| 2011/0192574 A1 * | 8/2011 | Yoshikawa et al. | 165/104.21 |

FOREIGN PATENT DOCUMENTS

| | | |
|---|---|---|
| JP | 4026039 A | 6/2000 |
| JP | 2002168547 A | 6/2002 |
| JP | 3924674 A | 7/2003 |
| JP | 2004335846 A | 11/2004 |
| JP | 2005195226 A | 7/2005 |
| JP | 2007034699 A | 2/2007 |
| JP | 2007335624 A | 12/2007 |
| JP | 2009267181 A | 11/2009 |
| SU | 1576833 A1 | 7/1990 |

OTHER PUBLICATIONS

Chinese Office Action for CN Application No. 201180017673.2 mailed on Dec. 20, 2013 with English Translation.

\* cited by examiner

PHASE CHANGE COOLER AND ELECTRONIC EQUIPMENT PROVIDED WITH SAME

TECHNICAL FIELD

The present invention relates to cooling of a semiconductor device and electronic equipment. The present invention in particular relates to a semiconductor cooling device that circulates a refrigerant by utilizing the phase change phenomenon and electronic equipment that includes this device.

BACKGROUND ART

In order to convey a large quantity of heat that is generated in a semiconductor or electronic equipment, a method has been developed to obtain a high cooling performance by bonding a material having a high heat conductivity to the outer unit of a semiconductor, and flowing a refrigerant through the inside thereof as a heat absorber. A method has also been developed that obtains a higher cooling effect by boiling the refrigerant with the heat absorber. In order to dissipate the heat that the refrigerant has snatched to the outside, it is necessary to cause the refrigerant to circulate between the heat absorbing unit and a heat radiating unit. Generally, a pump is employed for circulation of the refrigerant.

In the case of an ebullient cooling system, there has been proposed a thermal siphon-type cooling structure that, by installing a heat absorbing unit in the lower portion of the cooler and heat radiating unit in the upper portion, does not require a pump by utilizing the principle of vapor collecting upward with respect to the direction of gravity due to the difference in density between the vapor that is generated and the liquid. For example, this cooling structure is disclosed in Patent Document 1 and Patent Document 2. Patent Document 1 provides a siphon-type ebullient cooler for cooling a power semiconductor. This ebullient cooler is characterized by a structure in which the heat absorbing unit and the heat radiating unit are formed comparatively integrated, in addition to a pump not being required. In this ebullient cooler, there is a need to integrally mold the structure of the heat absorbing unit that is in contact with the heat generating body and the heat radiating unit and a circulation path of the refrigerant. For that reason, this ebullient cooler is expensive when miniaturizing it for electronic components, and so using it for various purposes is difficult.

Patent Document 2 provides a method that performs circulation of a refrigerant by installing a condenser above a boiling unit to produce a siphon effect. However, in an electronic apparatus, it is not always possible to extend a pipe upward and install the condenser due to the internal layout. Also, in the case of installing the pipe that is to be connected to the condenser vertically upward from an evaporator, it is unavoidable for condensation to occur in the pipe. In this case, a liquid membrane is formed in the pipe, and a flow is generated with it trying to return to the boiling unit due to gravity. This not only becomes resistance to the vapor that is heading toward the condenser, but also reduces the cross-sectional area of the evaporation path, thus producing pressure loss. As a result, not only is the performance of the condenser not exploited, but its operation as a cooler becomes unstable. Moreover, in the worst case, there is the risk of drying out of the evaporator being induced.

The structure disclosed in Patent Document 3 is the same as the structure disclosed in Patent Document 2. That is to say, in the structure of Patent Document 3, since the condenser is provided vertically above the evaporation heat absorbing unit, there is the destabilizing factor as was described in the above Patent Document 2. The structure of Patent Document 3 can be inexpensively produced since the refrigerant flow passage from the condenser to the evaporating unit and then to the condenser is formed by bending back a single pipe. However, this kind of structure is not suitable for the flow of refrigerant of both the liquid phase and the gaseous phase. Also, in the evaporator, heat reception is not performed over the entire heat generation surface.

In order to solve this issue, Patent Document 4 provides a structure that separates the liquid phase flow path and the gas phase flow path by making the tubing into a two-layer structure. With this structure, it is possible to improve the circulation characteristic of the refrigerant, while maintaining the characteristic of being able to install the heat radiating unit separate from the heat receiving unit. That is to say, it is possible to reduce the pressure loss between the heat radiating unit and the heat receiving unit, leading to an improvement of the cooling characteristic. All of the aforementioned proposals are attractive cooling methods in the case of there being an element having a dominant power consumption within the electronic device. However, in the case of there being a plurality of heat generating elements, a plurality of these coolers becomes necessary.

Patent Document 5 provides a structure that cools a plurality of heat generating parts, being a cooler that utilizes phase change. Heat receiving units of a number equal to the elements to be cooled are used, with the heat receiving units and the heat radiating units being constituted by a series fluid circuit. In this structure, the refrigerant that has vaporized by the heat received from the heat generating elements on the upstream side passes the heat receiving units of the elements on the downstream side. Since it is necessary for a liquid phase refrigerant to be supplied to the downstream side to cool the downstream side elements, a structure has been proposed that forcibly circulates the refrigerant with a pump. By using a pump, for example it is possible to change the flow rate in accordance with the amount of heat generation. However, as a cooling structure, it becomes complicated and expensive. Moreover, since the liquid phase refrigerant is forcibly supplied, during the heat movement from the elements to the refrigerant in the heat receiving unit, liquid cooling that does not accompany the phase change and ebullient cooling that accompanies the phase change are mixed. The heat-transfer property of ebullient cooling is higher. For this reason, increasing the ratio of ebullient cooling is desirable for improving performance. For that reason, Patent Document 5 is characterized by heating the refrigerant just before entering the heat receiving unit so as to put it in a state of easily undergoing phase change. The structure for heating makes the structure of the cooler more complicated and expensive. Moreover, there is the problem of the load on the heat radiating unit becoming unnecessarily large.

Patent Document 6 provides a cooler that targets a plurality of heat generating elements. This cooler is a structure that supplies refrigerant that has been cooled by a heat radiating unit to each heat receiving unit through pipes that are arranged in parallel, in order to optimize the cooling of each heat generating element. In this cooler a liquid cooling system is presumed, and so circulation of the refrigerant is needed for each circuit installed in parallel. The refrigerant flows back to the heat radiating unit that is aggregated into one element. The heat radiating unit is designed so as to dissipate the entire quantity of heat that is collected, but the heat dissipation efficiency is worse compared to the case of dissipating heat without the heat radiating units being aggregated.

PRIOR ART DOCUMENTS

Patent Documents

[Patent Document 1] Japanese Patent Publication No. 4026039 (FIG. 1)

[Patent Document 2] Japanese Unexamined Patent Application, First Publication No. 2002-168547 (Pages 6-7, FIG. 1, FIG. 2, FIG. 3)

[Patent Document 3] Japanese Unexamined Patent Application, First Publication No. 2005-195226 (Pages 13-17)

[Patent Document 4] Japanese Patent Publication No. 3924674 (FIG. 1)

[Patent Document 5] Japanese Unexamined Patent Application, First Publication No. 2009-267181 (FIG. 1)

[Patent Document 6] Japanese Unexamined Patent Application, First Publication No. 2007-335624 (FIG. 6)

SUMMARY OF THE INVENTION

Problem to be Solved by the Invention

As stated above, there are various problems in the cooling devices disclosed in Patent Documents 1 through 6. The first problem is miniaturization of the cooler. Electronic components are being mounted with a high density in electronic equipment, and this trend has become pronounced in recent years. With respect to the limited area in a device, the proportion occupied by heat radiators is large. In the case of a boiling refrigerant-type cooler with a high thermal transfer efficiency, it is possible to miniaturize the heat receiving unit and heat radiating unit. However, in a cooler in which the heat reception and heat dissipation are integrated, heat radiating fins require a large volume in the vicinity of components.

In Patent Document 2 and Patent Document 3, by separating the heat receiving unit and the heat radiating unit, the heat radiating unit can be installed away from the vicinity of a heat generating component. For that reason, it may be possible to solve the aforementioned problem. That is to say, it becomes possible to install the heat radiating unit, for example, near an apparatus' exhaust outlet, and so the possibility of miniaturizing at least the component mounting region increases. However, as the second problem, the absolute volume does not change just by separating the heat receiving unit and the heat radiating unit. That is to say, in a boiling refrigerant-type cooler in which the heat receiving unit and the heat radiating unit are in a paired relationship, during the cooling of a plurality of parts, a heat radiating area of that number is required. For example, in a server in which four CPUs are mounted, the heat radiating unit with respect to the outside air must be corresponds to four CPUs. As a result, compared to a device with one CPU mounted, quadruple the heat radiating area, and the volume therefor, become necessary.

The third problem concerns the number of the heat radiating units being required to be the same as that of heat generating units. Moreover, the area of heat dissipation and the volume of the heat radiating units are designed so as to be able to correspond in the case of each heat generating unit being driven at the maximum heat generating amount. For that reason, it is necessary to ensure the volume of heat radiating units to be installed so as to be proportional to the number of heat generating units. Conventional art includes an attempt to integrate the heat radiating units. For example, in Patent Document 6, by installing the heat receiving units in parallel, two pumps are required. Also, as another conventional art, by connecting the heat receiving units in a series manner, one pump is sufficient. However, in this structure, providing a partition in the inside of the heat receiving unit does no more than dissipate the heat from each heat receiving unit. These solutions show that, in the case of cooling a plurality of heat generating bodies, management of the flow rate is difficult simply by branching the flow path on downstream of the pump.

The fourth problem concerns the number of the cooling fans being also required to be the same as that of heat generating units. By providing fans that correspond to the heat generating units, that is to say, the heat radiating units, it is possible to operate the fans in accordance with the running state of the CPU that they respectively correspond to. This is effective from the standpoint of noise reduction and electricity power saving. On the other hand, since fans of a number equal to the heat radiating units are needed, there is no contribution to cost reduction.

If the heat radiating units are aggregated, it is possible to solve the aforementioned problems. However, as the fifth problem, the possibility arises of the heat dissipation property worsening. For example, when comparing the case of cooling one element and the case of cooling two elements, by increasing the radiation surface area in accordance with the heat generation amount, it is possible to maintain the cooling property. If the amount of heat generation is the same, double the radiation surface area becomes necessary. Since the flow rate also doubles, and the pumps controlling the flow rate become two, the effect of aggregating the heat dissipation unit is comparable to one heat dissipation radiator and one fan being eliminated.

The present invention has been conceived in view of these circumstances. One exemplary object of the present invention is, in an electronic device in which electronic parts or semiconductors are mounted as a plurality of heat generating bodies, even in the case of the operating ratio of a certain electronic part or the like being high, to provide a means of reliably cooling the electronic part.

Means for Solving the Problem

In order to attain the aforementioned object, a phase change cooler of the present invention includes: a plurality of heat receiving units that cause a refrigerant to change phase from liquid to gas by heat received from a heat generating body; one heat radiating unit that causes the refrigerant to change phase from gas to liquid by radiating heat to surrounding area; a plurality of vapor tubes that respectively transport the refrigerant in a vapor state from each of the heat receiving units to the heat radiating unit; a liquid tube that respectively circulates the refrigerant in a liquid state from the heat radiating unit to each of the heat receiving units; and a bypass tube that connects each of the heat receiving units to each other.

According to this constitution, the vapor flows into a heat exchange unit through a plurality of vapor tubes that are connected to the heat exchange unit, corresponding to the amount of heat received at each heat receiving unit. The condensed liquid phase refrigerant circulates to the heat receiving units through the liquid tube, installed at the lower portion of the heat exchange unit in the gravity direction, ranging from one to the number of heat receiving units. The amount of refrigerant supplied to each heat receiving unit corresponds to the amount lost through evaporation. The required liquid amount is supplied in a self sustaining manner without an active liquid driving apparatus. Also, in the case of the working ratio of a certain one part being in a high state, not only is the refrigerant supplied from the liquid tube to the heat receiving unit at which more refrigerant, upon receiving the heat from that part, evaporates, but the refrigerant is also supplied from the adjacent heat receiving unit via the bypass tube.

Effect of the Invention

According to the phase change cooler of the present invention, in the case of the working ratio of a certain one part being in a high state, not only is the refrigerant supplied from the liquid tube to the heat receiving unit at which more refrigerant, upon receiving the heat from that part, evaporates, but the refrigerant is also supplied from the adjacent heat receiving unit via the bypass tube. Accordingly, it is possible to more reliably cool a part with a high working ratio.

Also, according to the phase change cooler of the present invention, it is possible to make the number of heat radiating units fewer than the number of heat receiving units, and reduction in size and simplification of the cooling structure is achieved from the standpoint of the entire device. For example, by collecting the vapor from a plurality of heat receiving units into one heat radiating unit, not only is a reduction in cost achieved due to the fewer number of parts, but it is also possible to achieve a power saving due to the fewer number of fans that constitute the heat radiating unit.

EMBODIMENTS FOR CARRYING OUT THE INVENTION

[First Exemplary Embodiment]

Figure 1:
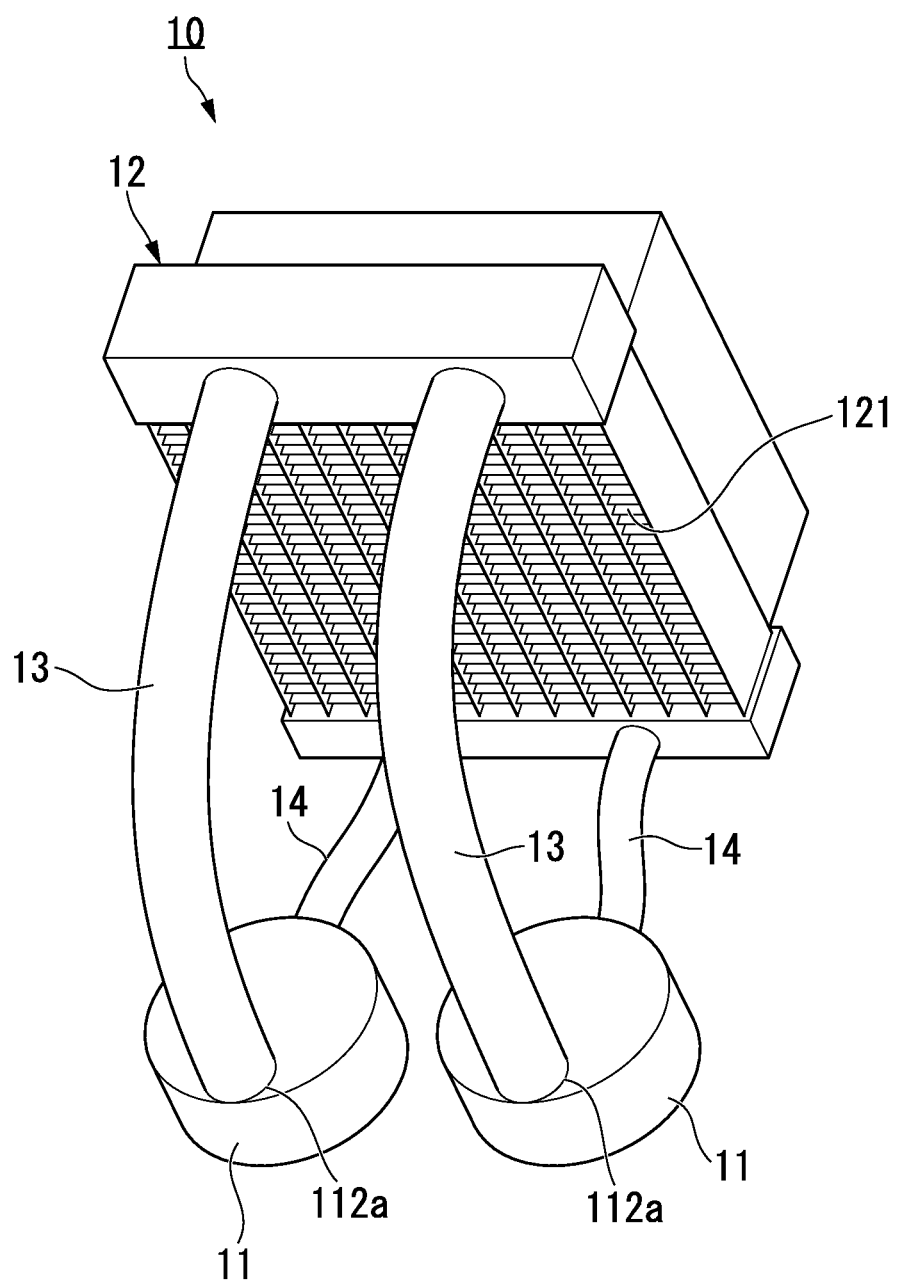
FIG. 1 is an outline perspective view that shows a phase change cooler according to a first exemplary embodiment of the present invention.
Figure 2:
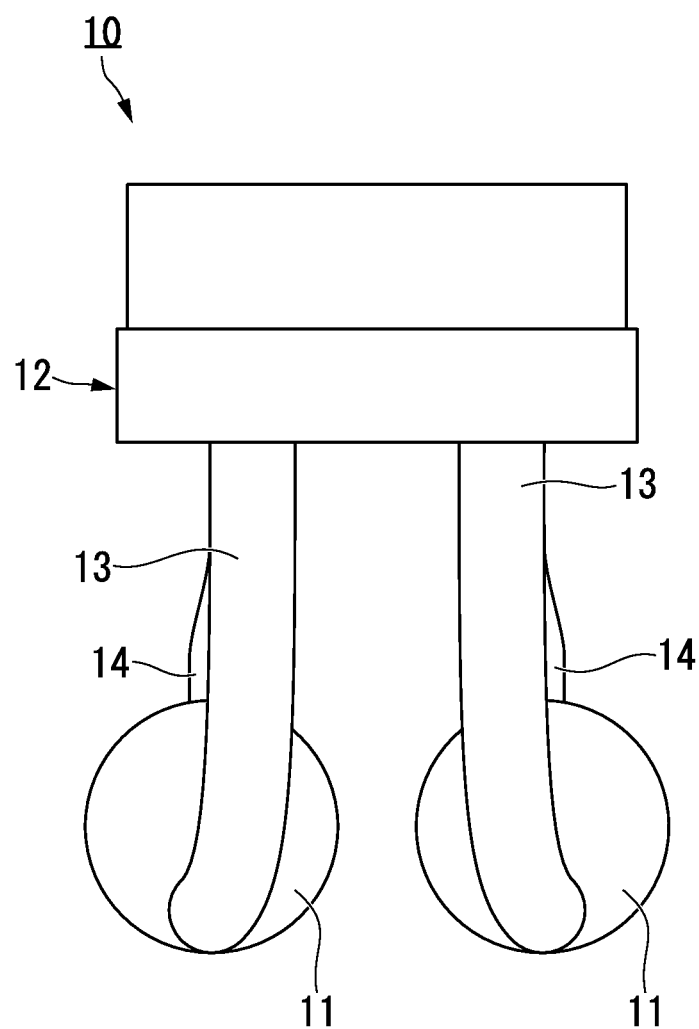
FIG. 2 is an outline plan view of the phase change cooler according to the first exemplary embodiment of the present invention.
Figure 3:
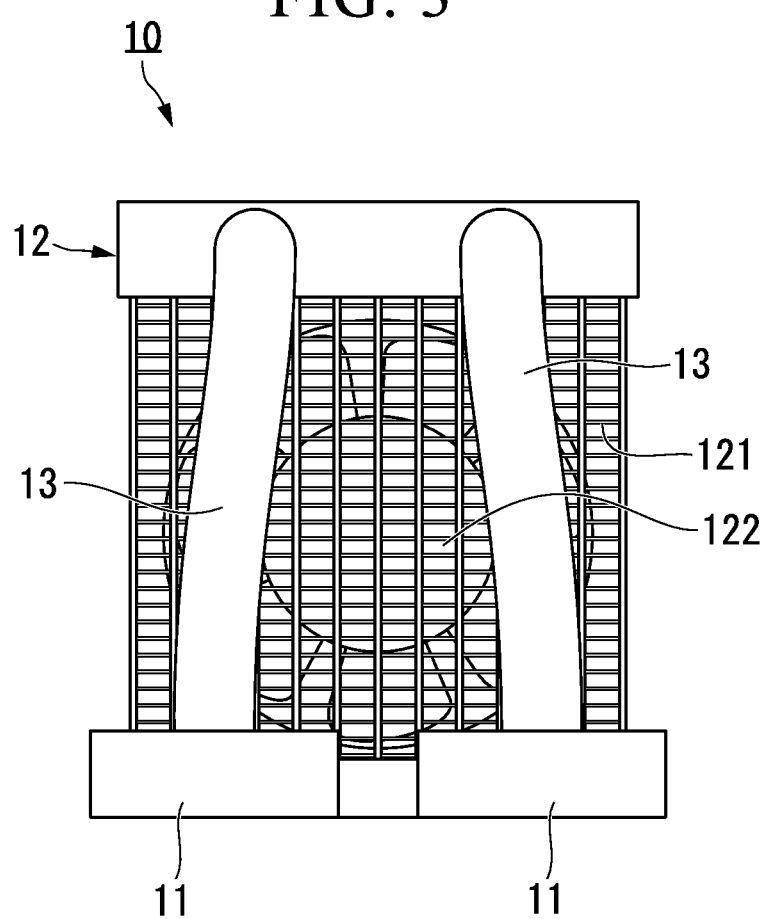
FIG. 3 is an outline front elevation of the phase change cooler according to the first exemplary embodiment of the present invention.

Hereinbelow, exemplary embodiments of the present invention shall be described with reference to the drawings. First, the constitution of a phase change cooler according to a first exemplary embodiment of the present invention shall be explained. FIGS. 1 to 3 show the constitution of a phase change cooler 10 of the present exemplary embodiment. FIG. 1 is an outline perspective view of the phase change cooler 10. FIG. 2 is an outline plan view of the phase change cooler 10 shown in FIG. 1. FIG. 3 is an outline front elevation of the phase change cooler 10 shown in FIG. 1.

FIG. 1 shows the phase change cooler 10 according to the first exemplary embodiment of the present invention that has two heat receiving units 11 and one heat radiating unit 12.

Figure 4:
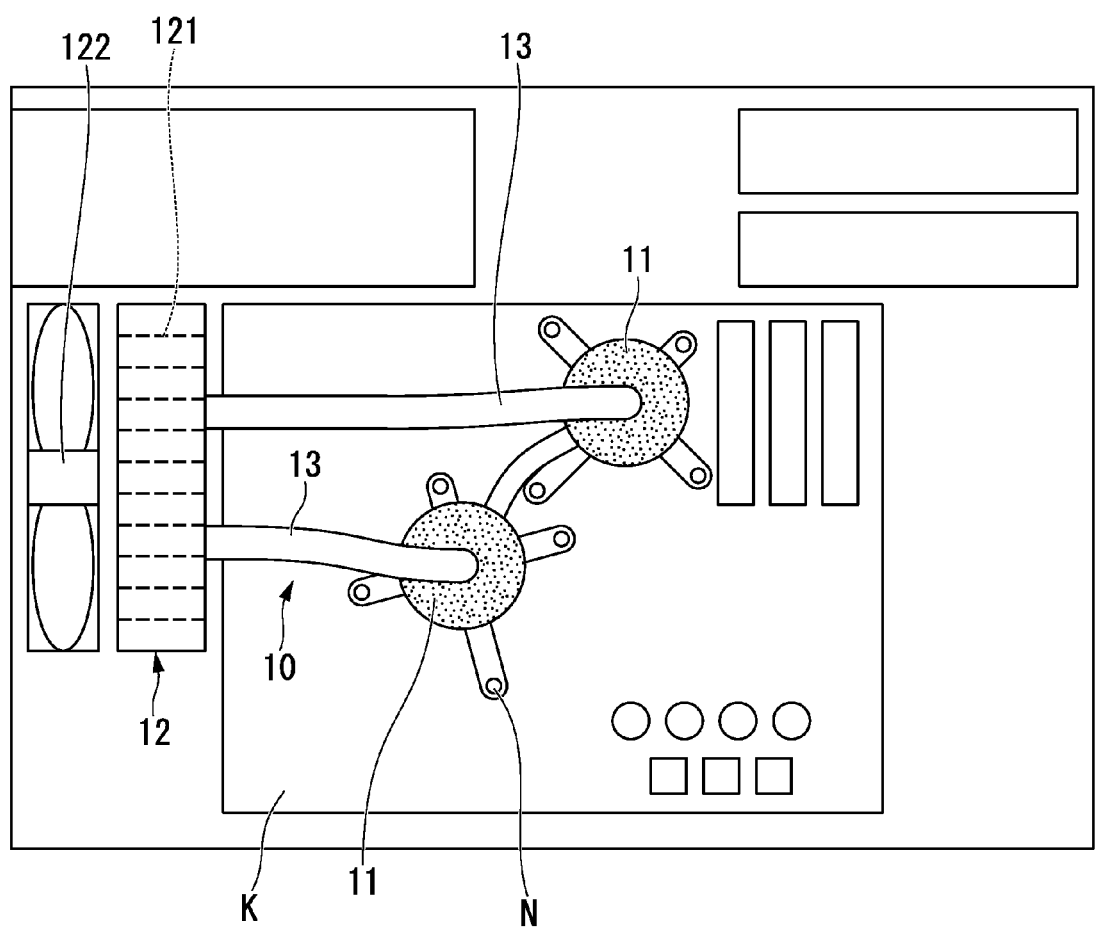
FIG. 4 is an outline plan view that shows an electronic device in which the phase change cooler according to an exemplary embodiment of the present invention is mounted.
Figure 5:
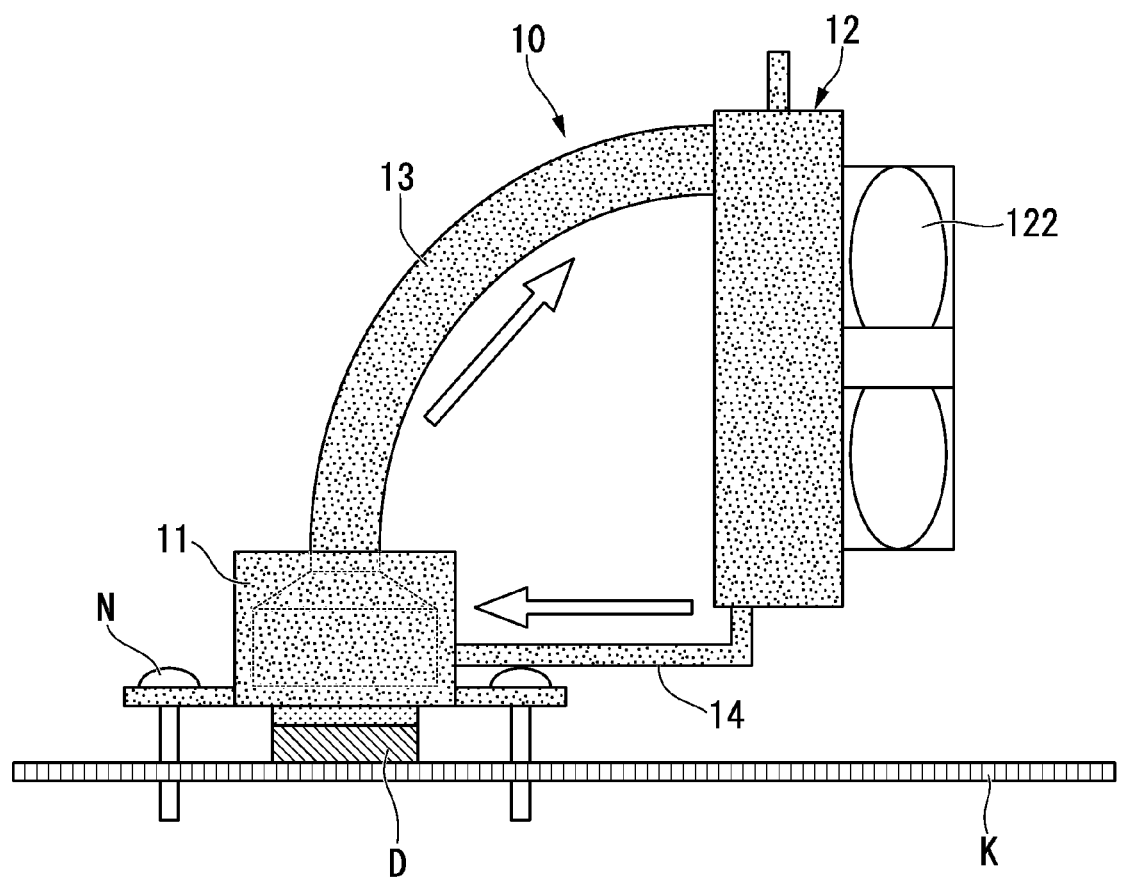
FIG. 5 is an outline longitudinal section view that shows an electronic device in which the phase change cooler shown in FIG. 1 is mounted.

As shown in FIGS. 4 and 5, an electronic part D provided on a substrate K is installed below the heat receiving unit 11 via thermally conductive grease, a heat radiation sheet, and the like. In order to maintain a thermal connection, the heat receiving unit 11 is fixed on the substrate K with screws N. At this time, it is preferable that a contact pressure occur between the heat receiving unit 11 and the electronic part D by imparting a spring property to the fixing structure. A bypass tube mutually connecting the heat receiving units 11 in a second exemplary embodiment described below is shown in FIG. 4.

As for this contact pressure, it is preferable for it to be pressure of 100 kPa to 1 MPa so as not to exceed the component specifications.

Figure 6:
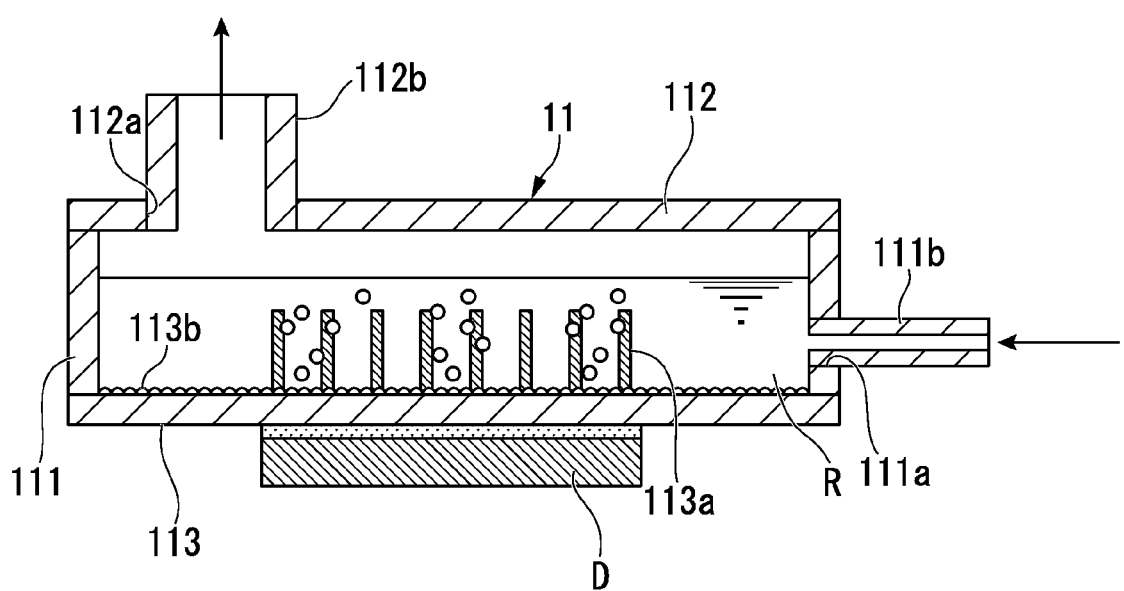
FIG. 6 is an outline longitudinal section view that shows the constitution of the heat receiving unit of the phase change cooler shown in FIG. 1.
Figure 7A:
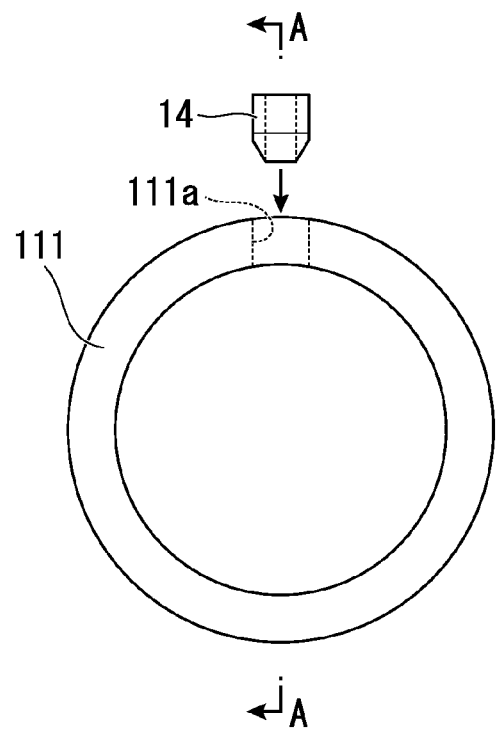
FIG. 7A is an outline plan view that shows a side wall unit that constitutes the heat receiving unit shown in FIG. 6.
Figure 7B:
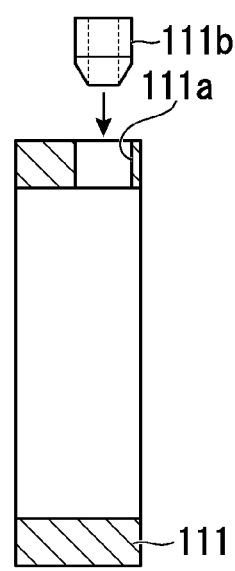
FIG. 7B is a cross-sectional view that shows the side wall unit taken along line A-A of FIG. 7A.
Figure 8A:
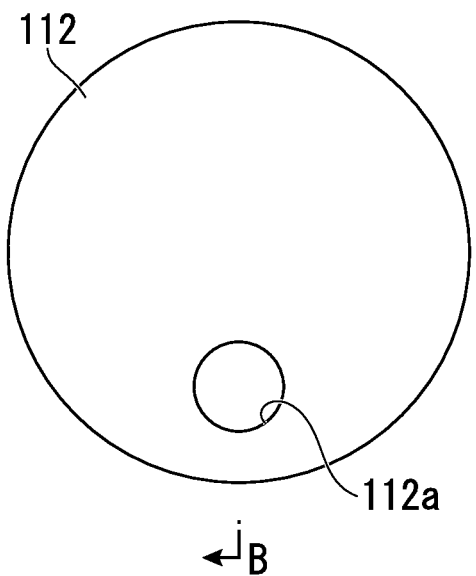
FIG. 8A is an outline plan view that shows a top plate that constitutes the heat receiving unit shown in FIG. 6.
Figure 8B:
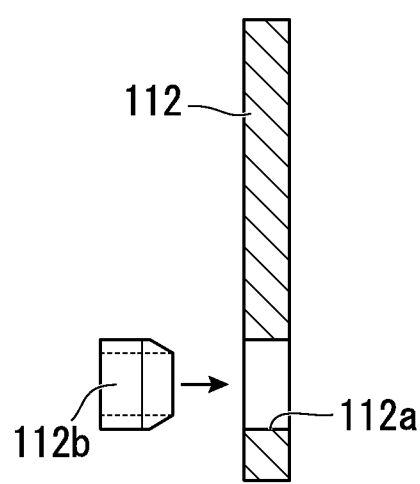
FIG. 8B is a cross-sectional view that shows the top plate taken along line B-B of FIG. 8A.
Figure 9A:
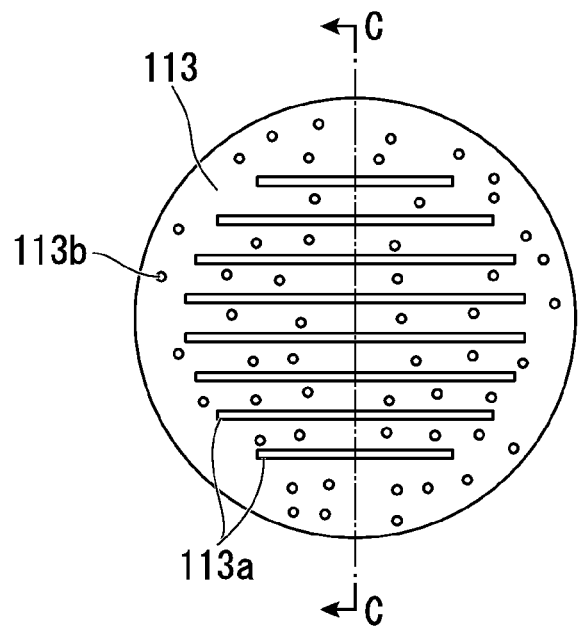
FIG. 9A is an outline plan view that shows a bottom plate that constitutes the heat receiving unit shown in FIG. 6.
Figure 9B:
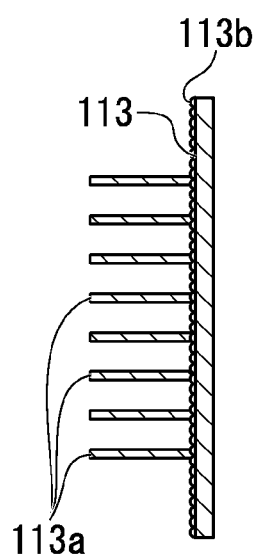
FIG. 9B is a cross-sectional view that shows the bottom plate taken along line C-C of FIG. 9A.
Figure 10A:
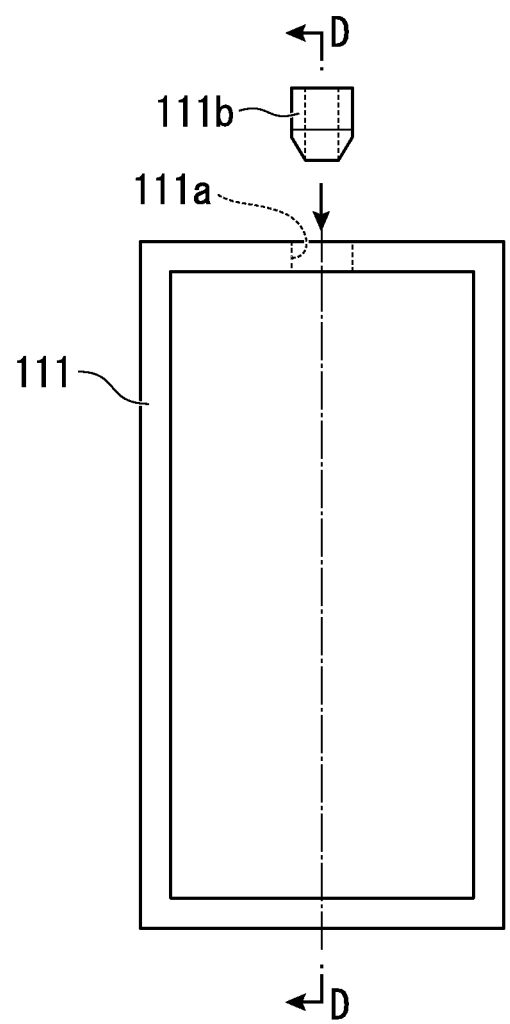
FIG. 10A is an outline plan view that shows the side wall unit in the case of the cross-sectional shape of the heat receiving unit shown in FIG. 6 being approximately rectangular.
Figure 10B:
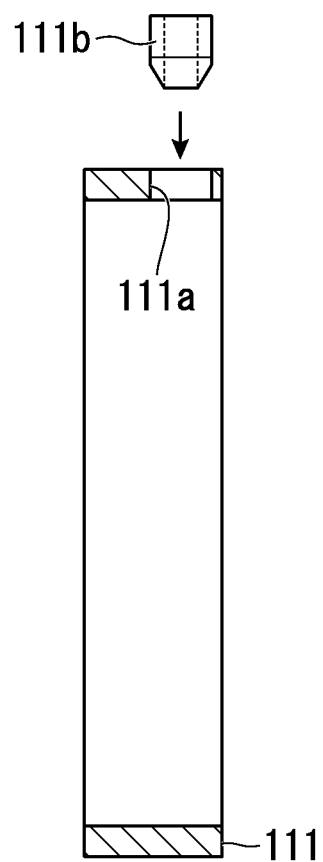
FIG. 10B is a cross-sectional view that shows the side wall unit taken along line D-D of FIG. 10A.
Figure 11A:
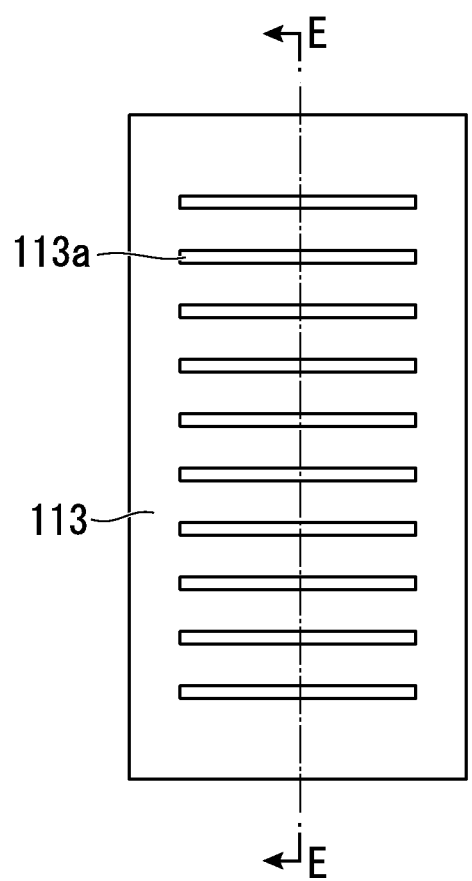
FIG. 11A is an outline plan view that shows the bottom plate in the case of the cross-sectional shape of the heat receiving unit shown in FIG. 6 being approximately rectangular.
Figure 11B:
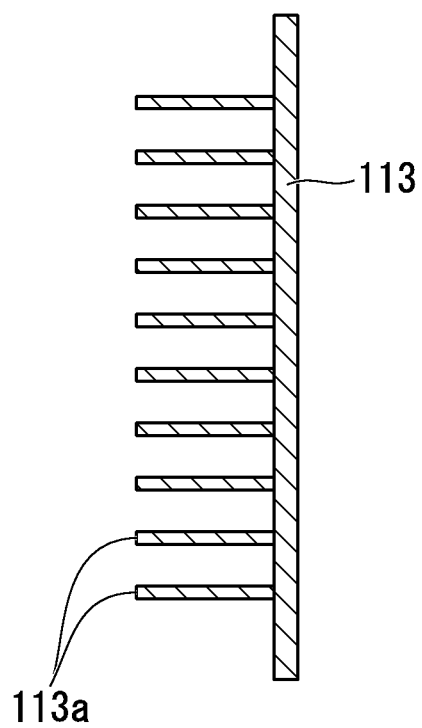
FIG. 11B is a cross-sectional view that shows the bottom plate taken along line E-E of FIG. 11A.

The heat receiving unit 11 is a hollow chamber with good thermal conductivity that is made of a metal such as copper or aluminum. FIG. 6 is an outline sectional view showing the heat receiving unit 11. The heat receiving unit 11 includes a side wall unit 111 (refer to FIG. 7A and FIG. 7B), a top plate 112 (refer to FIG. 8A and FIG. 8B), and a bottom plate 113 (refer to FIG. 9A and FIG. 9B). The side wall unit 111 has substantially a cylindrical shape. The top plate 112 has a round shape, and it is provided so as to cover one side opening of the side wall unit 111. The bottom plate 113 has substantially a round shape, and it is provided so as to cover the other side opening of the side wall unit 111. As shown in FIGS. 7A and 7B, a liquid inflow port 111a is formed penetrating the side wall unit 111. As shown in FIGS. 8A and 8B, a vapor outflow port 112a is formed penetrating the top plate 112. As shown in FIGS. 9A and 9B, a plurality of fins 113a for improving the heat conductivity to the refrigerant R are formed on the surface of the bottom plate 113 that is inside the chamber. Although not shown in detail in FIGS. 9A and 9B, flow paths for controlling the flow of liquid or vapor may also be formed on the surface of the bottom plate 113 that is inside the chamber. It is preferable that the interval of the fins 113a and the distance between the flow path walls are ensured to be around 1 mm to several mm or more so that the separation of bubbles that are produced is not hindered by the fins 113a or the flow paths. The surface of the bottom plate 113 that is inside the chamber is preferably roughened to a level of several 10 mm to several 100 mm by sandblasting or the like so as to become the nuclei of the generation of bubbles. With this structure, the number of nuclei when bubbles are generated increases. The cross-sectional shape of the heat receiving unit 11 is not limited to a cylindrical shape, and suitable design changes are possible. FIG. 10A to FIG. 11B show the constitution of the side wall unit 111 and the bottom plate 113 in the case of the cross-sectional shape of the heat receiving unit 11 being approximately rectangular.

Since the bottom plate 113 of the heat receiving unit 11 is in contact with the heat generating element, it is preferably formed using a material with high thermal conductivity. Copper and aluminum are widely used metals having high thermal conductivity. For this reason, using these materials, it is desirable to form it in an integrated manner from the surface that is in contact with the heat generating element to the flow control protrusions 113b. The first object of providing the flow control protrusions 113b is to distribute the liquid phase refrigerant R over the boiling face surface uniformly. It has the effect of preventing dryout, in which the liquid phase is used up during high heat generation, over the entire bottom unit, while always performing the supply of the required liquid in order to continue the boiling. In the case of using an organic refrigerant R, the surface tension is generally less than water, and so the diameter of the bubbles that form at the time of boiling is around 1.0 mm. In such a case, it is not desirable to make the distance between the flow control protrusions 113b extremely narrow to be less than the bubble diameter. It is preferable for the distance between the flow control protrusions 113b to be equal to or greater than the bubble diameter. The second object of the flow control protrusions 113b is to expand the heat radiating area. Considering the fact that the wider the surface area is, the greater the heat discharge amount, if the distance between the flow control protrusions 113b is made too great, the number of the flow control protrusions 113b that can be formed becomes limited. The amount of heat that passes through the inside of the flow control protrusions 113b depends on the thickness of the protrusions. The thicker the flow control protrusions 113b, more heat that flows. However, if the flow control protrusions 113b are made excessively thick, the heat dissipation surface area is limited. In consideration of these points, it is best to form the flow control protrusions 113b so as to satisfy the following conditions. That is to say, the distance between the flow control protrusions 113b is set to around 1.0 mm. The thickness of the flow control protrusions 113b is set to around 1.0 to 2.0 mm. The height of the flow control protrusions 113b is set to 1.0 to 5.0 mm. In the case of the flow control protrusion 113b structure with an aspect ratio of 1:5 in these millimeter scales, manufacturing by machining is one of the favorable methods. If the flow control protrusions 113b in the heat receiving unit 11 and the bottom plate 113 are integrally formed, it is possible to reduce the thermal resistance that occurs at the connection portions thereof compared to the case of forming them separately and then joining them. FIG. 6 shows an example in the case of the flow control protrusions 113b and the bottom plate 113 being integrally formed.

Inside the heat receiving unit 11, the refrigerant R undergoes a phase change with the heat from the electronic part D, and vapor is generated. This vapor passes along the vapor tube 13 at the upper part of the heat receiving unit 11 shown in FIG. 1, and heads toward the upper portion of the heat radiating unit 12, which is a radiator. The vapor tube 13 that is connected with another heat receiving unit 11 is also connected to the upper portion of the heat radiating unit 12. Corrugated-type heat radiating fins 121 are formed at the center portion of the heat radiating unit 12. Heat is dissipated by air that passes between the heat radiating fins 121. The flow of air is supplied as cooling air uniformly between the heat radiating fins 121 by an axial-flow fan 122 shown in FIG. 3. The diameter of the axial-flow fan 122 is about 120 mm, and is almost the same as the cross-sectional size of the heat radiating unit 12.

A plurality of vapor tubes 13 are connected to the upper portion of the heat radiating unit 12. The vapor from the plurality of heat receiving units 11 is carried to the heat radiating unit 12 via the plurality of vapor tubes 13, respectively. It is preferable for the plurality of vapor tubes 13 to be connected at a uniform interval to a surface at the upper portion of the heat radiating unit 12, on the side where the cooling air is discharged. For example, as shown in FIG. 1, the plurality of vapor tubes 13 may be uniformly aligned on the long-side side surface of the heat radiating unit 12. Although not shown in detail in the figure, the two vapor tubes 13 may also be respectively connected to the left and right side faces at the short sides of the heat radiating unit 12. As for the vapor tube 13 through which flows vapor whose density is comparatively low, it is desirable to enlarge the diameter in order for the pressure loss during vapor passage to be reduced to a minimum.

As shown in FIG. 1, one end of each of a plurality of liquid tubes 14 is connected to the lower portion of the heat radiating unit 12. Moreover, the other end of each liquid tube 14 is connected to each heat receiving unit 11, respectively. The tube diameter of the liquid tube 14 is small compared to the tube diameter of the vapor tube 13. When the entire cooler is in a steady state, the flow rate on a mass basis is same everywhere, but the flow rate on a volumetric basis greatly differs. This is due to the density greatly changing between a liquid and a gas. The diameter of the liquid tube 14 connected to the heat receiving unit 11 being small is also effective in the sense of preventing the mixing in of the vapor. As a result, it is possible to realize a system without a check valve that can prevent back flow or suppress to a minimum the effects thereof when back flow occurs.

Next, a supplementary explanation of a preferred structure of the phase change cooler 10 according to the exemplary embodiment of the present invention shall be given. Moreover, an outline of the manufacturing method of the phase change cooler 10 shall be described. As shown in FIG. 6, the side wall unit 111 is created using a material with high thermal conductivity (copper or aluminum). A condensate inflow unit 111b, on which a screw thread is formed, is screwed into the side wall unit 111. Next, the bottom plate 113 and the side wall unit 111 are joined by a means such as brazing. The main body of the heat receiving unit 11 is formed according to the above steps. Next, the heat receiving unit 11 is fabricated by joining the top plate 112 shown in FIGS. 8A and 8B that is similarly formed using a material with high thermal conductivity to the main body of the heat receiving unit 11 by a means such as brazing. The top plate 112 is formed integrally with a vapor outflow unit 112b in advance. Alternatively, the vapor outflow unit 112b, on which a screw thread is formed, is screwed into the top plate 112 in advance. By joining each unit by brazing, it is possible to obtain a heat receiving unit 11 with an airtight structure capable of withstanding pressure fluctuations during boiling.

Figure 12A:
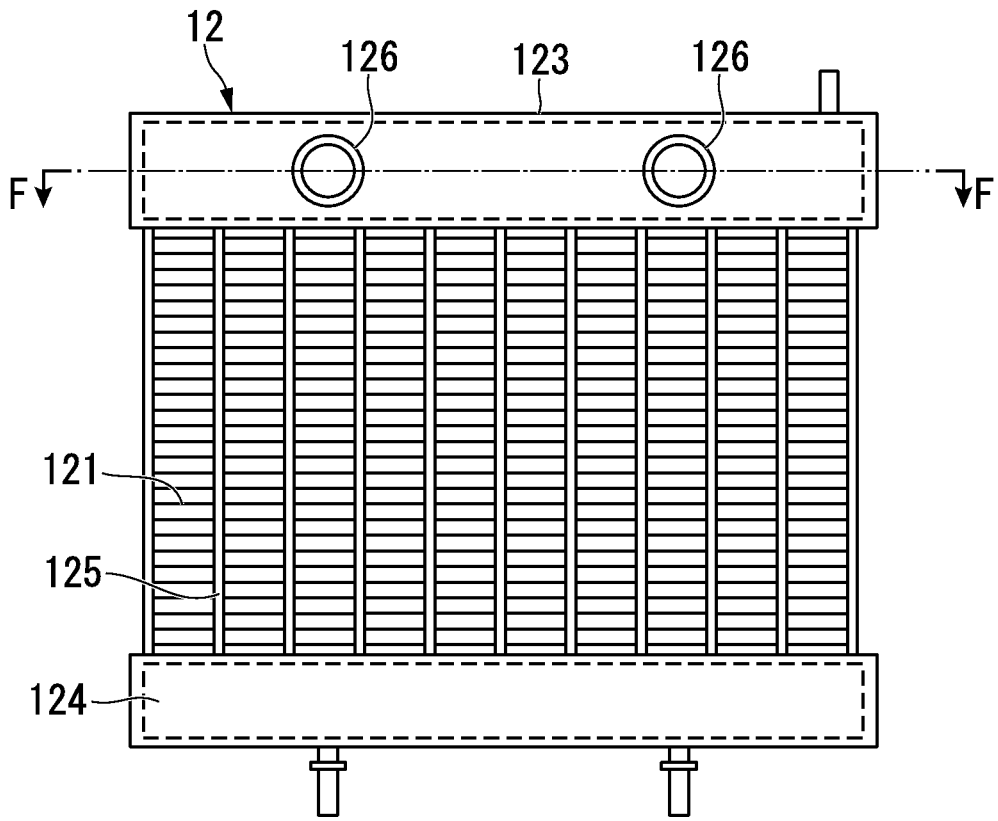
FIG. 12A is an outline front elevation that shows the heat radiating unit shown in FIG. 1.
Figure 12B:
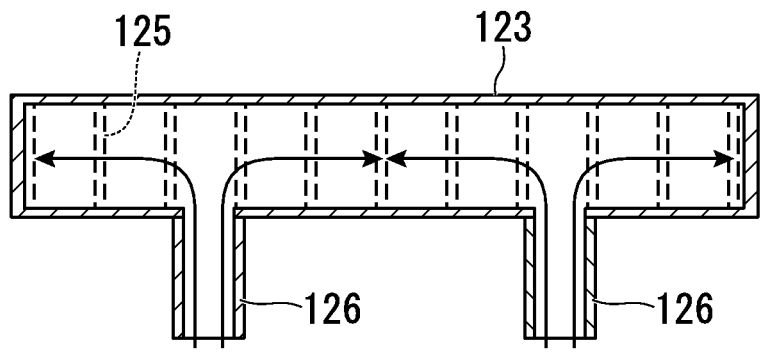
FIG. 12B is a cross-sectional view that shows the heat radiating unit taken along line F-F of FIG. 12A.

As shown in FIG. 12A, the heat radiating unit 12 is mainly constituted from a heat radiating unit header 123, a condensate collection unit 124, a refrigerant flow passage 125, and heat radiating fins 121. The basic structure of the heat radiating unit 12 resembles a radiator that is used in an automobile. However, in the exemplary embodiment of the present invention, since condensation of the refrigerant vapor is performed in addition to the heat dissipation, it is important to be able to carry out efficient heat dissipation in the condensation of the refrigerant R. As shown in the cross-sectional view taken along line F-F of FIG. 12B, connecting the vapor inflow port 126 in a perpendicular manner to the heat radiating unit header 123 is favorable. As a result, the vapor that flows into the heat radiating unit header 123 collides with the wall at the back surface side of the heat radiating unit header 123, and it is possible to cause it to disperse so as to permeate the heat radiating unit header 123. Thereby, the pressure inside the heat radiating unit header 123 can be made constant. Accordingly, it is possible to make the flow rates of the refrigerant flow passage 125 uniform.

From the standpoint of heat dissipation, the narrower the refrigerant flow passage 125 is the better, but from the standpoint of the flow of the condensed refrigerant R, a certain degree of thickness is required. In the exemplary embodiment of the present invention, condensation relies on the liquid phase exclusion capability, which depends on gravity. Ideally, the condensed refrigerant R forms a thin-film liquid phase on the inner wall of the flow passage, and is discharged by gravity to the condensate collection unit 124 side. On rare occasions, the vapor becomes bubbles in the condensed liquid phase and becomes trapped, and in such a case it serves as resistance to the discharge of the liquid phase. In order to avoid such a situation, the flow passage width should be a minimum. In the case of using an organic refrigerant, it is preferable to set the width of the flow passage inner surface to 0.3 mm or more, and from the standpoint of the heat dissipation property, similarly the width of the inner surface of the flow passage is preferably set to 1.0 mm or less.

It is desirable to use a flexible tubing material for the vapor tube 13 and the liquid tube 14 that connect the heat receiving unit 11 and the heat radiating unit 12. A polymer material has high flexibility, but it is water permeable. For this reason, the refrigerant R may leak out through the tubing wall surface. In order to realize a flexible connection, as the material of the vapor tube 13 and the liquid tube 14, adoption of a polymer material with low water permeability such as butyl rubber, a polymer tubing material in which a metallic thin film is laminated, a metal tubing material that maintains flexibility with a bellows shape and the like is favorable. It is preferable to provide an inflow/outflow nozzle at the positions where the vapor tube 13 or the liquid tube 14 are connected to the heat receiving unit 11 and the heat radiating unit 12. The vapor tube 13 or the liquid tube 14 is connected to this inflow/outflow nozzle. There is also the risk of leakage of the refrigerant R through the boundary between the connection portion and the vapor tube 13, or the liquid tube 14. For this reason, it is preferable to seal the connection portions using an adhesive material. It is also possible to use the vapor tube 13 or liquid tube 14 that uses a metal material for the connection of the heat receiving unit 11 and the heat radiating unit 12. By using a metal material, it is possible to improve the airtightness of the cooler interior, and so the effect of preventing leakage of the refrigerant is obtained. The same effect is acquired when using a tubing material in a laminated structure of a thin metal film and the above-mentioned polymer materials in order to maintain flexibility. Even in a metal tubing with a bellows shape, connection having flexibility is possible. As shown in FIG. 5, after the vapor tube 13 is drawn out perpendicularly upward from the heat receiving unit 11, and is bent to be approximately horizontal, it is connected to the heat radiating unit 12. This constitution can prevent the refrigerant that is condensed in the vapor tube 13 from flowing backward along the vapor tube 13. That is to say, since the pressure of the refrigerant in this vapor tube 13 decreases from the upstream side to the downstream side, the refrigerant at the most downstream portion easily condenses. For that reason, if backflow of the liquid layer that has condensed is prevented by forming the most downstream portion of the vapor tube 13 to be approximately parallel, more stable operation of the liquid phase cooler 10 becomes possible.

When the sealing of the connection portions is finished, the refrigerant is poured in through a refrigerant pouring inlet (not illustrated), and removal of included air is performed. Removing the air leads to the saturation vapor pressure of the refrigerant R inside of the phase change cooler 10. As one condition for selection of the refrigerant R, it is preferable for the saturation vapor pressure to be as close to 1 atm as possible. This is because when the saturation vapor pressure differs greatly from 1 atm, it is necessary to increase the strength of the phase change cooler 10. For example, Vertrel (trademark), one type of fluorinated refrigerant manufactured by DuPont, has a boiling point at an atmospheric pressure of 55° C. and has a saturation vapor pressure at room temperature of approximately 30 kPa. When considering the cooling of electronic equipment, since the difference between Vertrel and atmospheric pressure at room temperature is not so large, and since it is possible to keep it at 2 atm or less during operation, Vertrel is favorable as the refrigerant of the phase change cooler 10 of the exemplary embodiment of the present invention.

Next, the operation effect of the phase change cooler 10 according to the exemplary embodiment of the present invention shall be described. When the refrigerant R boils inside the heat receiving unit 11, since the specific gravity of the generated vapor is small compared to the liquid phase, it heads toward the vapor outflow port 112a located in the upper portion in the direction of gravity. With gently changing the angle, the vapor tube 13 carries the vapor toward the heat radiating unit 12 with low resistance. The vapor tube 13 being connected to the upper portion of the heat radiating unit 12 at the side where the cooling air is discharged is a good condition for ensuring the performance of the heat radiating unit 12. The vapor that is guided to the heat radiating unit 12 flows from the top to the bottom therein, and returns to liquid. The refrigerant R that has returned to liquid collects at the bottom of the heat radiating unit 12, moves through the liquid tube 14 in the direction of the arrow shown in FIG. 5, and returns to the heat receiving unit 11.

The refrigerant R that has reached the heat radiating unit 12 from the vapor inflow port 126 as vapor condenses while passing through the refrigerant flow passage 125. By the cooling air that flows between the heat radiating fins 121, the condensation heat transfers from the refrigerant R to the refrigerant flow passage 125 wall and the heat radiating fins 121, and is dissipated. The condensed refrigerant R flows into the condensate collection unit 124, which is relatively in the lower portion in the gravity direction. The amount of liquid that accumulates in the condensate collection unit 124 is determined so as not to interfere with the vapor from the upper portion of the heat radiating unit 12. The condensed refrigerant R of the condensate collection unit 124 is supplied to the respective heat receiving units 11 by gravity.

Figure 13:
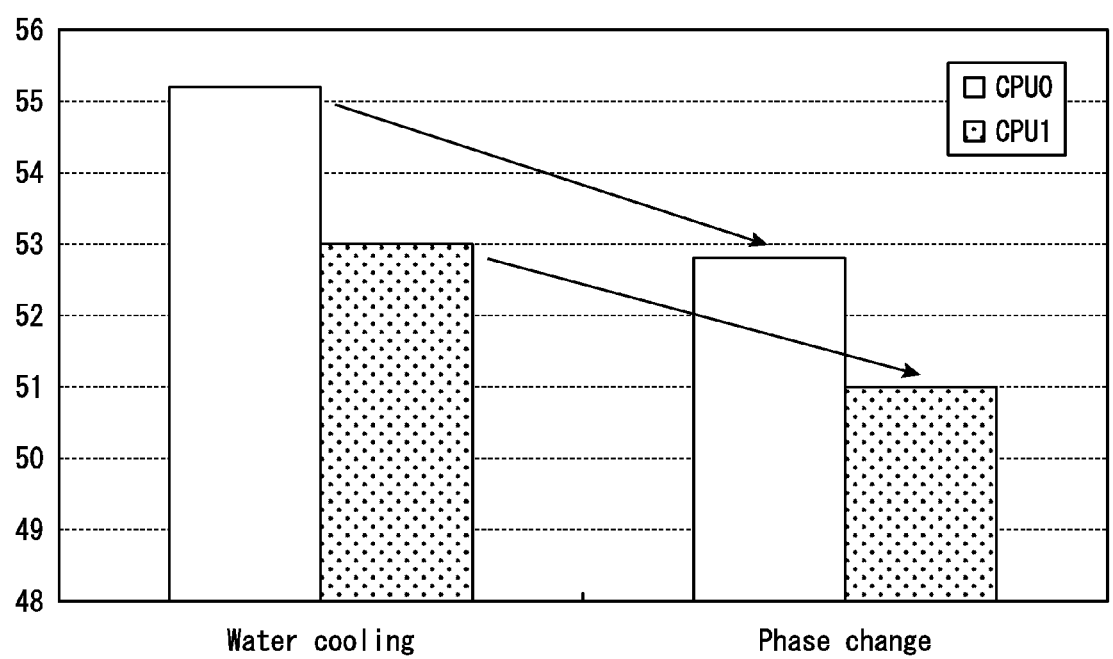
FIG. 13 is a graph that shows the evaluation result of the phase change cooler of FIG. 1 in a work station in which two CPUs are mounted.

Due to the structure of concentrated heat radiation of the exemplary embodiment of the present invention, cooling of the refrigerant R with one axial flow fan 122 is possible. Accordingly, the cooling structure is simple and a reduction in power consumption is possible. For example, as shown in FIG. 13, when the case of adopting the phase change cooler 10 in a workstation that has two CPUs (CPU0 and CPU1) ("phase change" in FIG. 13) is compared with the case of cooling by water cooling that leads to a doubling of thermal resistance ("water cooling" in FIG. 13), it is possible to hold down an increase of thermal resistance. The same effect is obtained even in servers, personal computers, supercomputers and the like in which arithmetic elements such as CPUs are mounted. The cooling target is not limited to arithmetic elements such as CPUs, and may be any heat generating body. The same effect is obtained even by adopting the phase change cooler 10 in network devices such as a routers in which a plurality of heat generating bodies are mounted, and in LED projectors that have a plurality of light emitting elements and optical devices and projectors utilizing LCD and DMD.

Moreover, in the present exemplary embodiment, since the interior of the heat radiating unit 12 is an integrated structure in which there are no partitions, in the case of a low amount of generated heat of an electronic device D from which one heat receiving unit 11 receives the heat, it is possible to use the entire heat radiating unit 12 for cooling of an electronic device D at which another heat receiving unit 11 receives the heat. Thereby, the effect is obtained of thermal resistance decreasing.

Also, in the present exemplary embodiment, each vapor tube 13 is connected to the surface of the heat radiating unit 12 at the side at which cooling air is discharged. According to this kind of constitution, it is possible to restrain the thickness of the heat radiating unit 12 in the direction that is approximately perpendicular to the discharge direction of the cooling air, and it is possible to achieve a reduction in thinness of the heat radiating unit 12.

[Second Exemplary Embodiment]

Figure 14A:
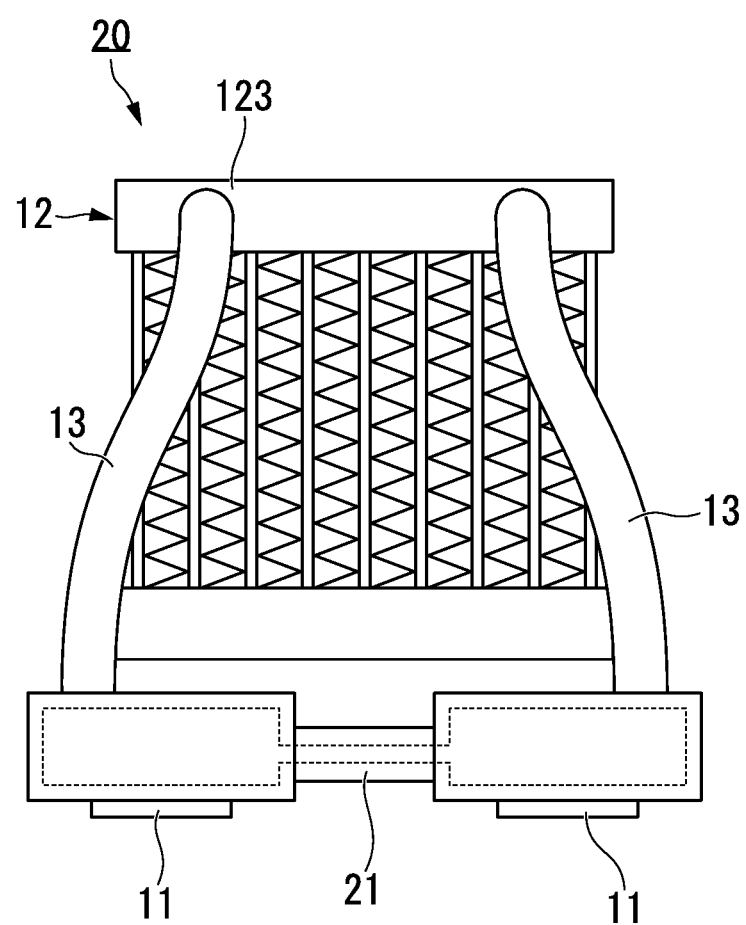
FIG. 14A is an outline front elevation that shows a phase change cooler according to a second exemplary embodiment of the present invention.
Figure 14B:
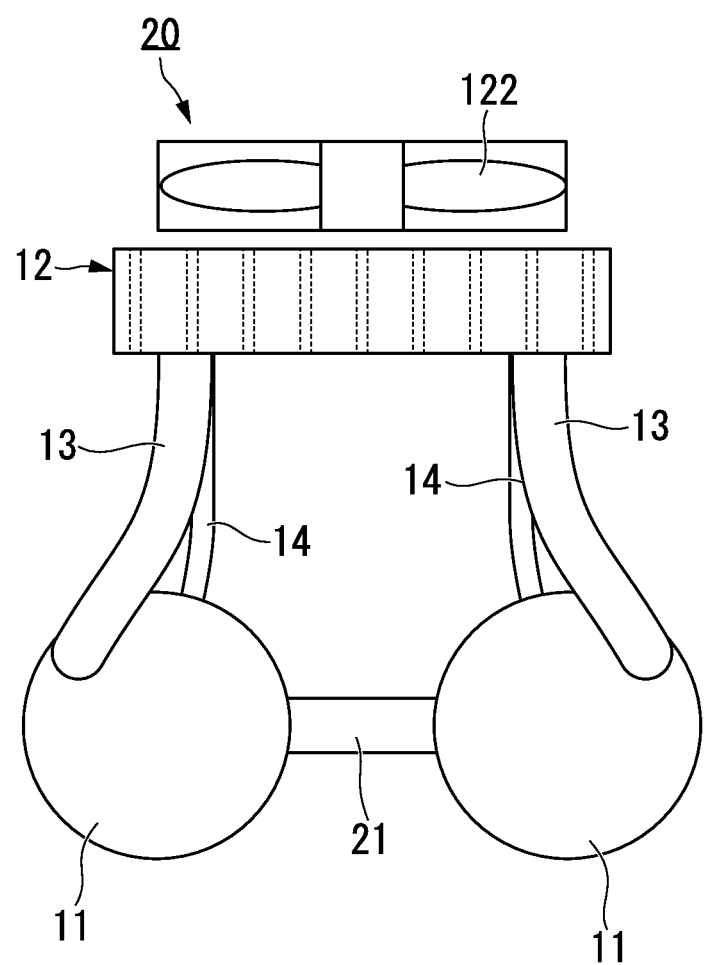
FIG. 14B is an outline plan view that shows the phase change cooler according to the second exemplary embodiment of the present invention.

Next, a phase change cooler 20 according to a second exemplary embodiment of the present invention shall be described. As shown in FIG. 14A and FIG. 14B, in the phase change cooler 20, a bypass tube 21 that mutually connects the heat radiating units 11 is provided in order to maintain the supply capability of the refrigerant R to the heat receiving units 11. There is a great possibility of the amount of heat generation changing with the working ratio of the heat generating electronic part D in an electronic device. By providing the bypass tube 21, in the case of the working ratio of one electronic part D being in a high state, the liquid is supplied not only from the liquid tube 14, but also from the adjacent heat receiving unit 11.

When the bypass tube 21 is connected so as to directly connect a plurality of heat receiving units 11 in this way, the supply capability of the liquid phase refrigerant R improves, and it is possible to maintain a good cooling performance even for example during rapid changes in the amount of heat generation. By fabricating the bypass tube 21 with a flexible material, it is possible to properly mount the plurality of heat receiving units 11 on the respective electronic parts D to be cooled, and it is possible to individually perform management of the contact conditions important for cooling.

[Third Exemplary Embodiment]

Figure 15:
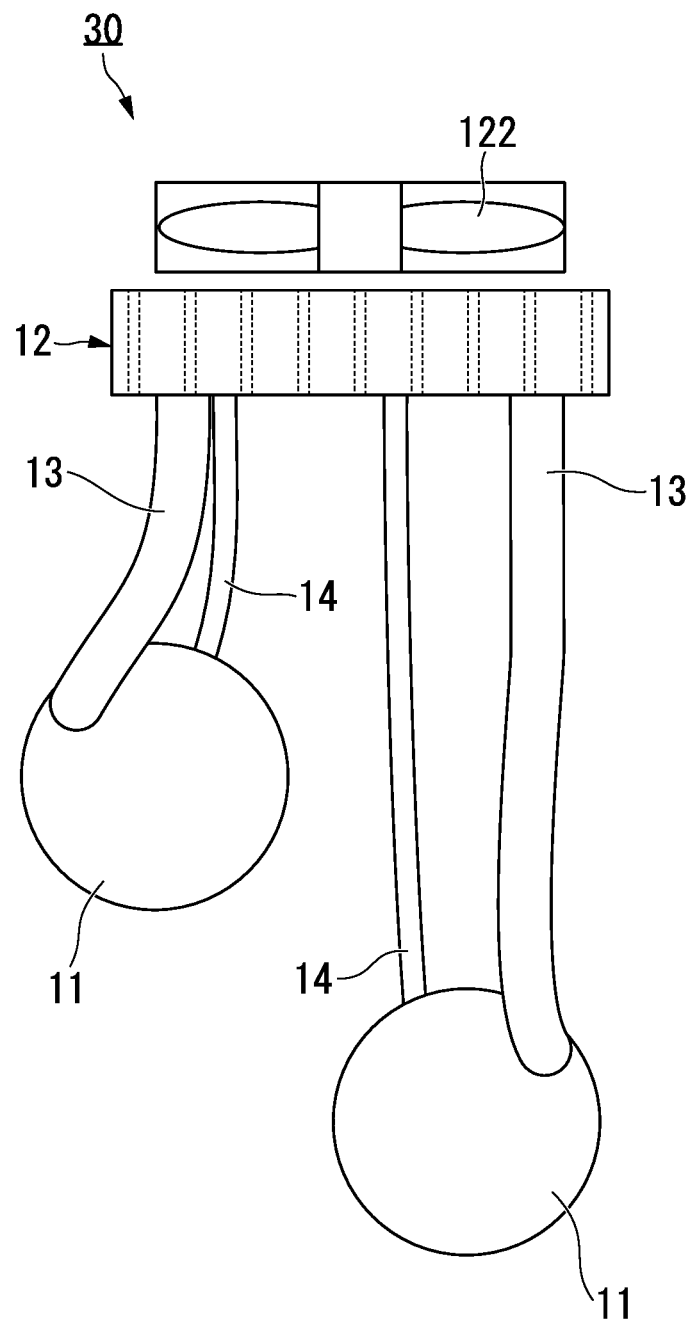
FIG. 15 is an outline front plan view that shows a phase change cooler according to a third exemplary embodiment of the present invention.

Next, a phase change cooler 30 according to a third exemplary embodiment of the present invention shall be described. As shown in FIG. 15, in the phase change cooler 30, the respective lengths of the vapor tube 13 and the liquid tubes 14 differ for each heat receiving unit 11. In electronic devices and the like in which the phase change cooler 30 according to the exemplary embodiment of the present invention is applied, with regard to the installation position of the heat generating electronic part D, requirements from the perspective other than cooling such as electricity are also important. In the case where the positions of the electronic parts D and the heat radiation position are determined, and the distance between each heat receiving unit 11 and the heat radiating unit 12 differs, by extending the vapor tube 13 and the liquid tube 14 as needed, it is possible to maintain the cooling performance. Also, use in conjunction with the bypass tube 21 of the second exemplary embodiment is preferred.

[Fourth Exemplary Embodiment]

Figure 16A:
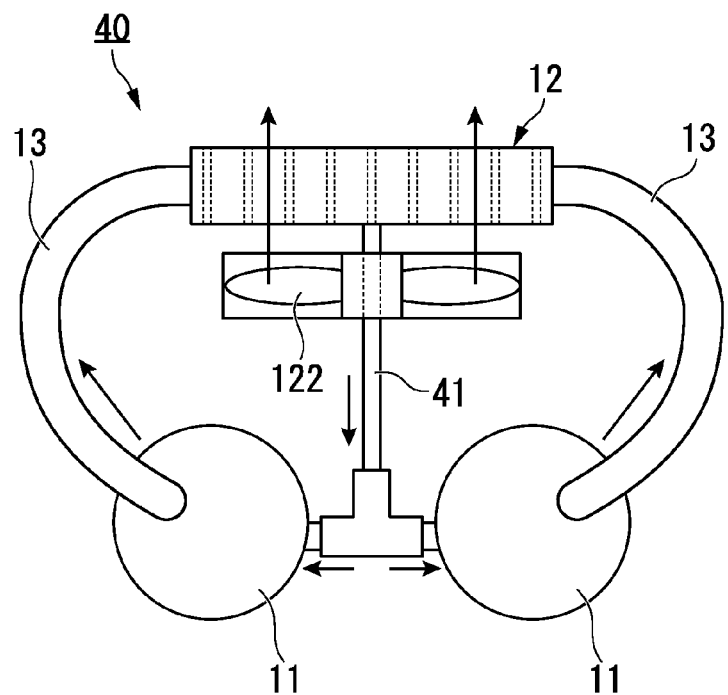
FIG. 16A is an outline plan view that shows a phase change cooler according to a fourth exemplary embodiment of the present invention.
Figure 16B:
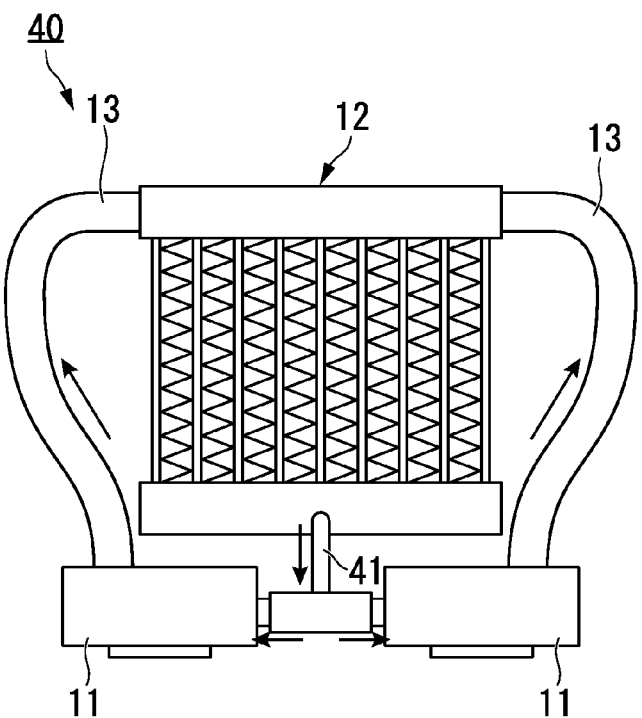
FIG. 16B is an outline front elevation that shows the phase change cooler according to the fourth exemplary embodiment of the present invention.

Next, a phase change cooler 40 according to a fourth exemplary embodiment of the present invention shall be described. As shown in FIG. 16A and FIG. 16B, in the phase change cooler 40, the vapor tubes 13 that are connected to the two heat receiving units 11 are respectively connected to the two mutually opposing surfaces that constitute the heat receiving unit 12, in greater detail, the two surfaces that are approximately perpendicular with the surface from which the cooling air is discharged.

In the case of each vapor tube 13 being connected to a side surface on the short side of the heat radiating unit 12, since the vapor tube 13 and the liquid tube 14 are not on the flow path of the cooling air, it is possible to increase the ventilation efficiency, and it is possible to improve the cooling performance.

Also, as shown in FIG. 16A and FIG. 16B, in the phase change cooler 40, the one end side of the liquid tube 41 is connected to the heat radiating unit 12 at one location. The other end side of the liquid tube 41 is branched and respectively connected to each heat receiving unit 11. In other words, the liquid tube 41 has one end portion that is connected to the heat radiating unit 12 at one location and another end portion that has a plurality of branched branch portions that are respectively connected to each heat receiving unit 11.

There is a high possibility of the liquid tube 41 that is installed downward in the gravity direction needing to be installed near the mounting region of the electronic part D inside the electronic device. Reducing the number of liquid tubes 41 that are arranged in this region is preferable in the state of the electronic parts D being mounted in high density.

[Fifth Exemplary Embodiment]

Figure 17A:
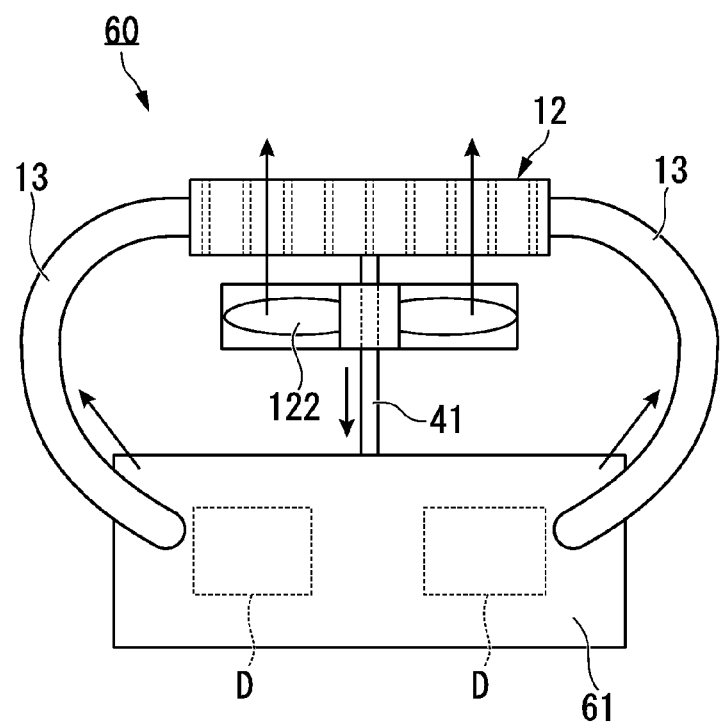
FIG. 17A is an outline plan view that shows a phase change cooler according to a fifth exemplary embodiment of the present invention.
Figure 17B:
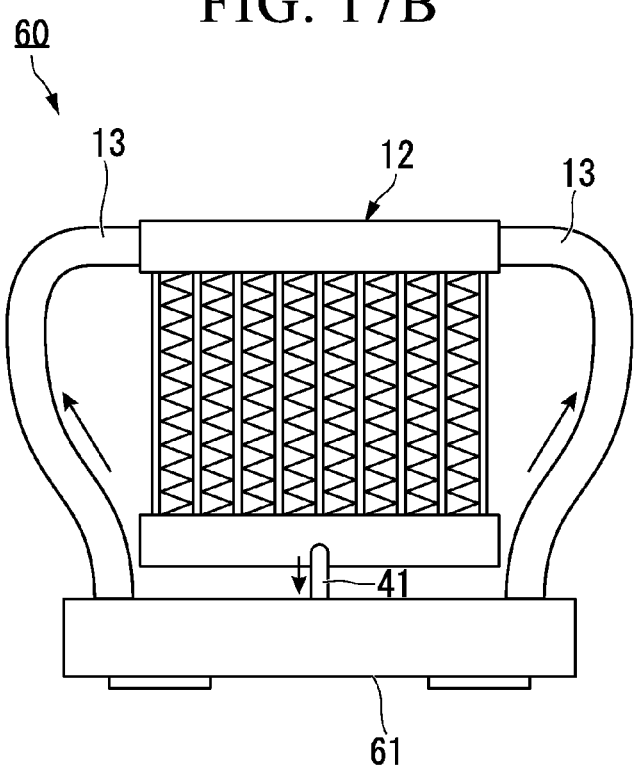
FIG. 17B is an outline front elevation that shows the phase change cooler according to the fifth exemplary embodiment of the present invention.

Next, a phase change cooler 60 according to a fifth exemplary embodiment of the present invention shall be described. As shown in FIG. 17A and FIG. 17B, in the phase change cooler 60, one heat receiving unit 61 and one heat radiating unit 12 are mutually connected via the vapor tube 13 and the liquid tube 14.

In electronic devices in which heat generating electronic parts D are mounted at a high density, there are instances in which integration of the heat receiving structures is preferred. It is preferable for the diameter of each vapor tube 13 to be determined in accordance with the amount of heat generated by each corresponding electronic part D. Also, by providing vapor outflow ports in the heat receiving unit 61 in the vicinity of the electronic parts D, a refrigerant circulating system with low pressure loss is formed, and efficient vapor discharge, that is, cooling of the electronic parts D, is achieved. Also, due to there being one heat receiving unit 61, since it is possible to reduce the number of liquid tubes 41, not only is the structure simplified, but also it contributes to a lowering of the risk of refrigerant leakage during use.

This application is based upon and claims the benefit of priority from Japanese patent application No. 2010-076126, filed Mar. 29, 2010, the disclosure of which is incorporated herein in its entirety by reference.

INDUSTRIAL APPLICABILITY

A phase change cooler of the present invention can be applied to cooling of electronic equipment such as computers and servers, network devices, and personal computers. Also, it can be applied to cooling applications of optical equipment such as projectors and displays.

Although the present invention has been described with reference to the exemplary embodiments, the present invention is not limited to the above embodiments. Various changes that can be understood by a person skilled in the art may be made in the configuration and the details of the present invention without departing from the scope of the present invention.

DESCRIPTION OF REFERENCE SYMBOLS

11 Heat receiving unit
12 Heat radiating unit
13 Vapor tube
14 Liquid tube
21 Bypass tube
113b Flow control protrusion
121 Heat radiating fin
122 Axial-flow fan
123 Heat radiating unit header
125 Refrigerant flowpath
D Electronic part
K Substrate
N Screw
R Refrigerant

The invention claimed is:

1. A phase change cooler comprising:
   a plurality of heat receiving units that include first and second heat receiving units different from each other, each of the first and second heat receiving units including a bottom plate having an outer surface and an inner surface opposite from the outer surface, the outer surface being in contact with an electronic part that is a cooling target, and a plurality of fins provided on the inner surface, the first and second heat receiving units causing a refrigerant to change phase from liquid to gas by heat received from the electronic part;
   one heat radiating unit that causes the refrigerant to change phase from gas to liquid by radiating heat to a surrounding area;
   a plurality of vapor tubes that include first and second vapor tubes different from each other, the first vapor tube having a first end directly connected to the heat radiating unit and a second end directly connected to the first heat receiving unit, the first vapor tube transporting the refrigerant in a vapor state from the first heat receiving unit to the heat radiating unit, the second vapor tube having a first end directly connected to the heat radiating unit and a second end directly connected to the second heat receiving unit, the second vapor tube transporting the refrigerant in a vapor state from the second heat receiving unit to the heat radiating unit, the first vapor tube and the second vapor tube being connected to different side surfaces of the heat radiating unit, respectively; and
   a branched liquid tube that has a first end directly connected to the heat radiating unit, a second end directly connected to the first heat receiving unit, and a third end directly connected to the second heat receiving unit, the branched liquid tube circulating the refrigerant in a liquid state from the heat radiating unit to each of the first and second heat receiving units.

2. An electronic device comprising the phase change cooler according to claim 1.

3. The phase change cooler according to claim 1, wherein the different side surfaces are first and second mutually opposing surfaces of the heat radiating unit, the first vapor tube is connected to the first surface of the heat radiating unit, and the second vapor tube is connected to the second surface of the heat radiating unit.

4. The phase change cooler according to claim 1, wherein the different side surfaces include first and second side surfaces of the heat radiating unit, the first side surface faces in a direction opposite to a direction in which the second side surface faces, the first vapor tube is connected to the first side surface of the heat radiating unit, and the second vapor tube is connected to the second side surface of the heat radiating unit.

5. The phase change cooler according to claim 1, wherein each fin among the plurality of fins of the first and second heat receiving units has a plate shape.

6. The phase change cooler according to claim 1, wherein the inner surface of each of the first and second heat receiving units includes a plurality of protrusions.

7. The phase change cooler according to claim 1,
   wherein the first heat receiving unit further includes:
      a top plate that is above the bottom plate of the first heat receiving unit, and is connected to the second end of the first vapor tube; and
      a side wall unit that has an opening covered by the bottom plate of the first heat receiving unit, and an opening covered by the top plate of the first heat receiving unit, the side wall unit being connected to the second end of the branched liquid tube.

8. The phase change cooler according to claim 7, wherein the fins provided on the inner surface of the first heat receiving unit extend toward the top plate and are spaced apart from the top plate.

9. The phase change cooler according to claim 7,
wherein the bottom plate of the first heat receiving unit has a substantially round shape,
the top plate has a substantially round shape, and
the side wall unit has a substantially cylindrical shape.

10. The phase change cooler according to claim 1, wherein the electronic part includes a central processing unit (CPU).

11. The phase change cooler according to claim 1, wherein the branched liquid tube is connected to a surface of the heat radiating unit which is different from the side surfaces of the heat radiating unit.

12. The phase change cooler according to claim 1, wherein the heat radiating unit causes the refrigerant to change phase from gas to liquid by cooling air, and the cooling air is discharged from a surface of the heat radiating unit which is different from the side surfaces of the heat radiating unit.

13. The phase change cooler according to claim 12, wherein the cooling air blows in a surface of the heat radiating unit which is different from the side surfaces of the heat radiating unit.

14. The phase change cooler according to claim 12, wherein the branched liquid tube is connected to the surface from which the cooling air is discharged.

15. The phase change cooler according to claim 12, wherein the branched liquid tube is connected to a surface of the heat radiating unit which is opposite from the surface from which the cooling air is discharged.

* * * * *